(12) United States Patent
Hsu et al.

(10) Patent No.: US 7,091,608 B2
(45) Date of Patent: Aug. 15, 2006

(54) CHIP PACKAGE

(75) Inventors: Jimmy Hsu, Taipei Hsien (TW); Ted Hsu, Taipei Hsien (TW)

(73) Assignee: Chunghwa Picture Tubes, Ltd., Taipei (TW)

( * ) Notice: Subject to any disclaimer, the term of this patent is extended or adjusted under 35 U.S.C. 154(b) by 0 days.

(21) Appl. No.: 11/064,136

(22) Filed: Feb. 22, 2005

(65) Prior Publication Data

US 2006/0065959 A1   Mar. 30, 2006

(30) Foreign Application Priority Data

Sep. 30, 2004   (TW) .............................. 93129546 A

(51) Int. Cl.
*H01L 23/48* (2006.01)
*H01L 23/52* (2006.01)
*H01L 29/40* (2006.01)

(52) U.S. Cl. ...................... 257/738; 257/777; 257/778; 257/780

(58) Field of Classification Search ........ 257/734–738, 257/777–783
See application file for complete search history.

(56) References Cited

U.S. PATENT DOCUMENTS 6,093,969 A * 7/2000 Lin ............................ 257/777
6,218,731 B1 * 4/2001 Huang et al. ................ 257/738
6,521,980 B1 * 2/2003 Tandy et al. ................. 257/738
6,822,337 B1 * 11/2004 Bai ............................ 257/783
6,969,914 B1 * 11/2005 Fuller et al. ................. 257/780

* cited by examiner

*Primary Examiner*—Cuong Nguyen
(74) *Attorney, Agent, or Firm*—J.C. Patents

(57) ABSTRACT

The chip package comprising a package substrate, a circuit layer, a chip and at least one conductive wire is provided. The circuit layer is disposed on a first surface of the substrate, and extends from the first surface to a second surface of the substrate via the inner surface of a slot of the substrate. The chip is disposed on the second surface of the substrate to cover the slot and a portion of the circuit layer. The chip has at least one signal pad and at least one non-signal pad. The non-signal pad is electrically connected to the circuit layer on the second surface. The slot in the substrate exposes the signal pad. One end of the conductive wire passing through the slot is connected to the signal pad while the other end thereof is connected to the circuit layer on the first surface of the substrate.

20 Claims, 2 Drawing Sheets

CHIP PACKAGE

CROSS-REFERENCE TO RELATED APPLICATION

This application claims the priority benefit of Taiwan application serial no. 93129546, filed on Sep. 30, 2004.

BACKGROUND OF THE INVENTION

1. Field of the Invention

The present invention relates to a chip package. More particularly, the present invention relates to a wire-through-slot type of chip package.

2. Description of the Related Art

With the rapid development in semiconductor manufacturing techniques in recent years, various high-performance electronic products are introduced, and integrated circuits (IC) with a higher level of integration are produced. Concurrent with the advance in operating speed and function of IC components, the heat generated by the IC units must be rapidly dissipated through proper channels. Otherwise, overheating may cause a temporary or permanent breakdown of the IC devices. Therefore, IC packaging plays a vital role in the IC fabrication process. Because IC devices are generally fabricated on a semiconductor chip before enclosing the semiconductor chip to form a package, this part of the packaging process is often called chip packaging.

In the past, the technique for packaging a dynamic random access memory (DRAM) includes wire bonding. First, the contact points of a chip disposed on a module board are electrically connected to a plurality of contact points (so called gold fingers) on the module board through a plurality of conductive wires. Thereafter, an encapsulant is used to encapsulate the chip and the conductive wires. However, with the increase of the operating speed of the DRAM, the amount of heat generated by the DRAM in operation also increases. To increase the heat-dissipating rate of the DRAM, a micro-ball grid array package (micro-BGA package) has been developed.

FIG. 1 is a schematic cross-sectional view of a conventional micro-ball grid array package. As shown in FIG. 1, the micro-ball grid array package 100 comprises a package substrate 110, a circuit layer 120, a chip 130, a plurality of conductive wires 140, an encapsulant 150, and a plurality of solder balls 160. The package substrate 110 has a first surface 110a, a second surface 110b on the other side of the first surface 110a and a slot 112. The circuit layer 120 is disposed on the first surface 110a and around the slot 112. The chip 130 is disposed on the first surface 110b to cover the slot 112. The chip 130 has a plurality of signal pads 132 and a plurality of non-signal pads 134. The non-signal pads 134 are ground pads or power pads, for example. The slot 112 exposes the signal pads 132 and the non-signal pads 134. Furthermore, the two ends of some of the conductive wires 140 connect the signal pads 132 with the circuit layer 120 while the two ends of other conductive wires 140 connect the non-signal pads 134 with the circuit layer 120.

The encapsulant 150 encapsulates the chip 130, the conductive wires 140 and a portion of the circuit layer 120. The solder balls 160 are disposed on the circuit layer 120 for electrical connection with an external device. It should be noted that the signals from the chip 130 are transmitted to the external device via the signal pads 132, corresponding conductive wires 140, the circuit layer 120 and the solder balls 160. In addition, return current is inputted to the chip 130 via other solder balls 160, the circuit layer 120, corresponding conductive wires 140 and the non-signal pads 134.

Since the return current must travel through the conductive wires 140 of the micro-ball grid array package 100 before returning to the chip, the return loop of the returning current is longer. Furthermore, the conductive wires 140 and the circuit layer 120 of the micro-BGA package 100 are a source of impedance mismatch. Hence, the conventional micro-BGA package 100 has a higher insertion loss and return loss. In addition, the loop inductance also increases when the chip 130 outputs high-frequency signals.

SUMMARY OF THE INVENTION

Accordingly, one objective of the present invention is to provide a chip package with better electrical properties.

To achieve these and other advantages and in accordance with the purpose of the invention, as embodied and broadly described herein, the invention provides a chip package. The chip package comprises a package substrate, a circuit layer, a chip and at least one conductive wire. The package substrate has a first surface, a second surface and a slot penetrating the package substrate. The circuit layer is disposed on the first surface of the package substrate. The circuit layer extends from the first surface to the second surface of the package substrate via the inner surface of the slot. The chip is disposed on the second surface of the package substrate to cover the slot and a portion of the circuit layer. The chip has at least one signal pad and at least one non-signal pad. The non-signal pad is electrically connected to the circuit layer on the second surface. Furthermore, the slot in the package substrate exposes the signal pad. The conductive wire passes through the slot. One end of the conductive wire is connected to the signal pad while the other end of the conductive wire is connected to the circuit layer on the first surface of the package substrate.

Accordingly, the chip package of the present invention utilizes a slot with a conductive wall to replace the conventional conductive wire so that the chip package has improved electrical properties.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1:
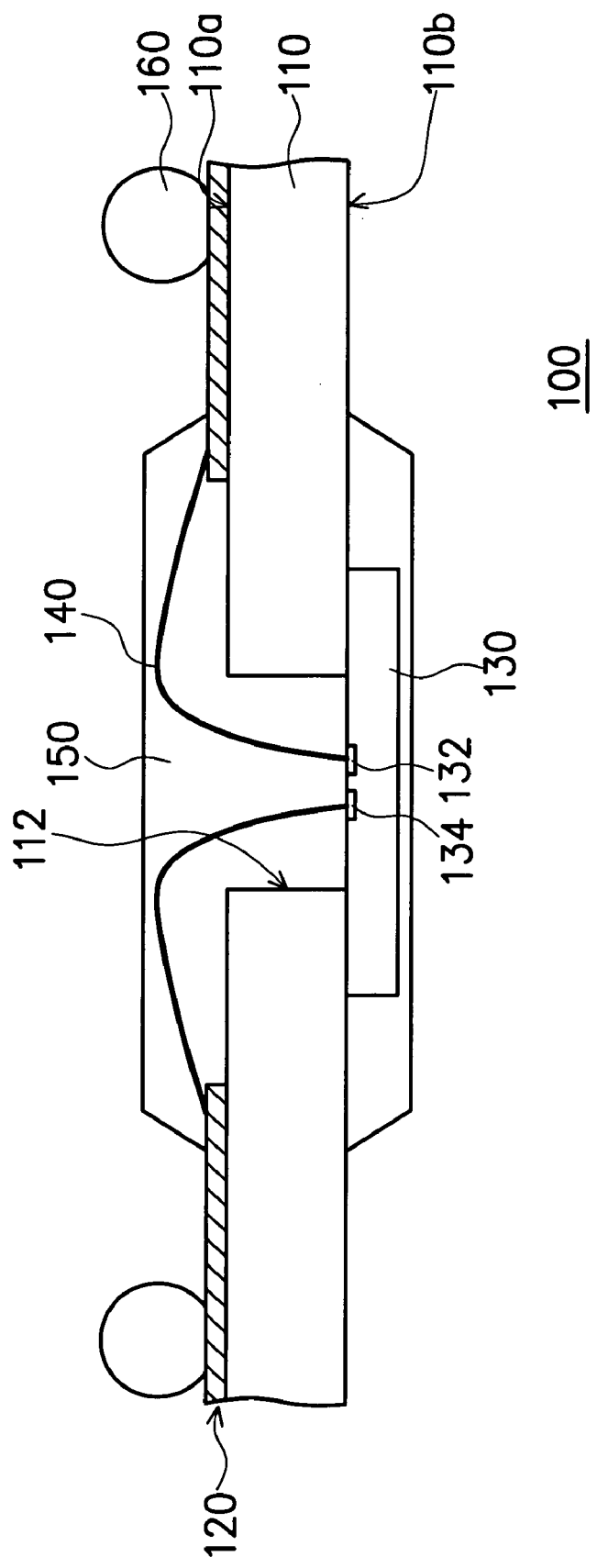
FIG. 1 is a schematic cross-sectional view of a conventional micro-ball grid array package.

Reference will now be made in detail to the present embodiments of the invention, examples of which are illustrated in the accompanying drawings. Wherever possible, the same reference numbers are used in the drawings and the description to refer to the same or like parts.

Figure 2:
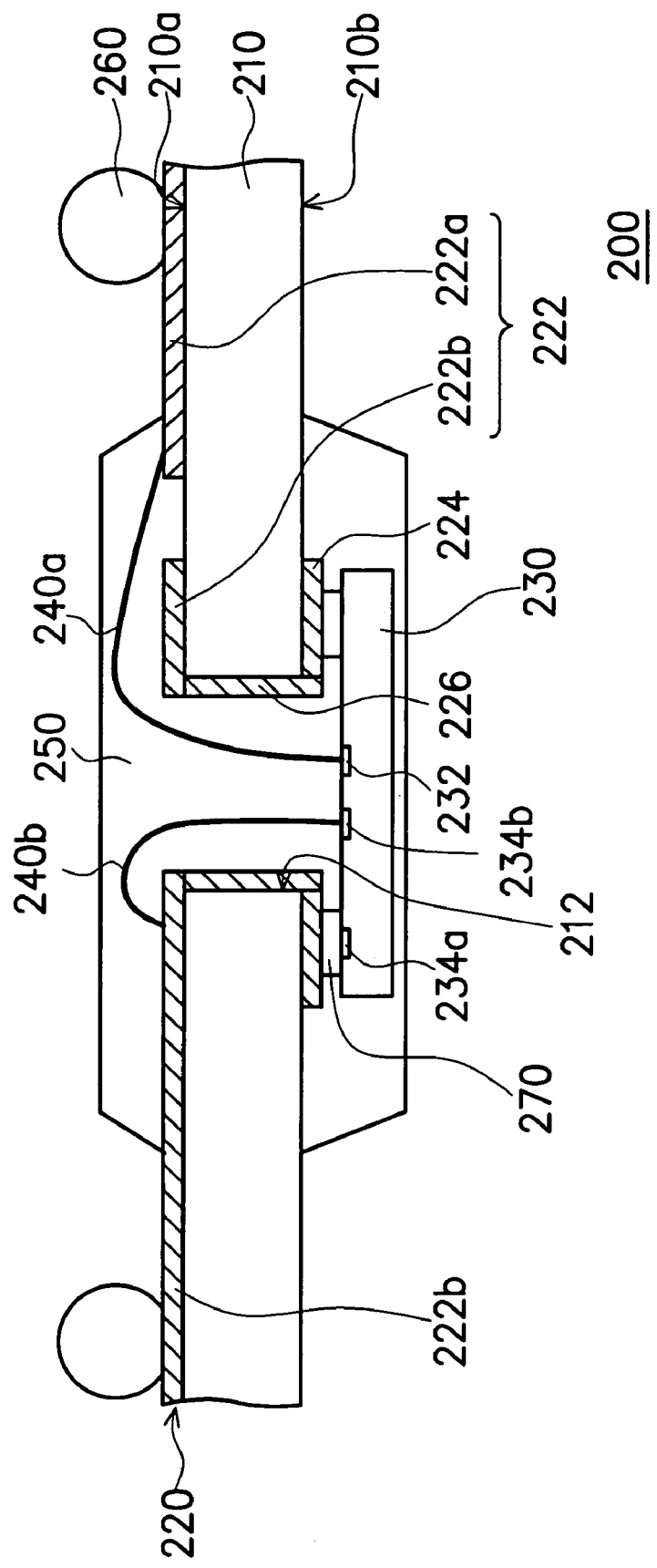
FIG. 2 is a schematic cross-sectional view of a chip package according to one embodiment of the present invention.

FIG. 2 is a schematic cross-sectional view of a chip package according to one embodiment of the present invention. As shown in FIG. 2, the chip package 200 comprises a package substrate 210, a circuit layer 220, a chip 230 and a plurality of first conductive wires 240a. The package substrate 210 has a slot 212. The transection of the slot 210 can be rectangular, circular or other geometric shapes, for example. The circuit layer 220 is disposed on a first surface 210a of the package substrate 210. The circuit layer 220 extends from the first surface 210a through the inner surface of the slot 212 into a second surface 210b of the package substrate 210. The chip 230 is disposed on the second surface 210b of the package substrate 210 to cover the slot 212 and a portion of the circuit layer 220. The chip 230 has at least one signal pad 232 and at least one non-signal pad 234a. The first non-signal pad 234a is connected to the circuit layer 220 on the second surface 210b.

The first non-signal pad 234a is electrically connected to the second patterned conductive layer 224 through a conductive layer 270 disposed between the first non-signal pad 234a and the second patterned conductive layer 224, for example. The conductive layer 270 is fabricated using conductive adhesive or solder material, for example. Furthermore, the slot 212 in the package substrate 210 exposes the signal pad 232. The first conductive wire 240a passes through the slot 212. One end of the first conductive wire 240a is connected to the signal pad 232 while the other end of the first conductive wire 240a is connected to the circuit layer 220 on the first surface 210a of the package substrate 210.

The aforementioned circuit layer 220 may comprise a first patterned conductive layer 222, a second patterned conductive layer 224 and a conductive wall 226. The first patterned conductive layer 222 is disposed on the first surface 210a of the package substrate 210. The first patterned conductive layer 222 further comprises at least a signal terminal 222a and at least a non-signal terminal 222b. The non-signal terminal 222b is disposed around the slot 212. The second patterned conductive layer 224 is disposed on the second surface 210b of the package substrate 210 and around the slot 212. Furthermore, the second patterned conductive layer 224 is electrically connected to the first non-signal pad 234a of the chip 220. The conductive wall 226 is disposed on the inner surface of the slot 212. The conductive wall 226 connects the non-signal terminal 222b of the first patterned conductive layer 222 and the second patterned conductive layer 224.

It should be noted that the non-signal terminal 222b of the first patterned conductive layer 222, the second patterned conductive layer 224 and the conductive wall 226 can be structurally divided into different sections to form different transmission channels, such as ground channel (plane) or power channel (plane). In this case, some of the first non-signal pads 234a can be ground pads while some other non-signal pads 234a can be power pads. In addition, the chip 230 may include additional second non-signal pads 234b exposed by the slot 212. The second non-signal pad 234b is electrically connected to non-signal end 222b of the first patterned conductive layer 222 through a second conductive wire 240b passing through the slot 212. The second non-signal pad 234b is a ground pad or a power pad, for example.

Accordingly, signals outputted from the first non-signal pad 234a of the chip 230 can be transmitted to the non-signal end 222b of the first patterned conductive layer 222 after passing through the conductive layer 270, the second patterned conductive layer 224 and the conductive wall 226. Furthermore, the signals outputted from the second non-signal pad 234b of the chip 230 can be transmitted to the non-signal terminal 222b of the first patterned conductive layer 222 through the second conductive wire 240b. The first non-signal pad 234a and the second non-signal pad 234b are ground pad or power pad, for example. In other words, the chip package of the present invention can provide a better return loop for transmitting signals, thereby reducing the loop inductance. Consequently, the chip package of the present invention not only provides a wider operating frequency range but also better electrical properties. More importantly, the present invention uses a slot with a conductive wall instead conductive wire for signal transmission, thus reducing the return loss of signals and avoiding impedance mismatch. Therefore, high-frequency signals can be completely transmitted.

To protect the electrical connection between the chip 230 and the package substrate 210 of the chip package 200, a layer of encapsulant 250 is also formed to encapsulate at least the chip 210, the first conductive wires 240a and the second conductive wires 240b. Furthermore, for electrical connection between the chip 230 and external circuits, the chip package 200 also has a plurality of contact points 260 disposed on the signal terminal 222a and the non-signal terminal 222b of the first patterned conductive layer 222. The contact points 260 can be solder balls arranged in area array. It should be noted the contact points 260 are not limited to solder balls. The contact points 260 can be pins or other forms, for example.

In summary, the present invention has at least the following advantages.

1. The chip package has a shorter signal return loop and a smaller loop inductance so that overall electrical properties are improved.

2. The chip package can operate at a wider operating frequency range, compared with the prior art.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A chip package, comprising:
a package substrate with a first surface, a second surface and a slot penetrating the package substrate;
a first patterned conductive layer disposed on the first surface of the package substrate, wherein the first patterned conductive layer has at least a signal terminal and at least a non-signal terminal, and the non-signal terminal is disposed around the slot;
a second patterned conductive layer disposed on the second surface of the package substrate and around the slot;
a conductive wall disposed on the inner surface of the slot, wherein the conductive wall connects the non-signal terminal of the first patterned conductive layer with the second patterned conductive layer;
a chip disposed on the second surface of the package substrate to cover the slot, wherein the chip has at least a signal pad and at least a first non-signal pad, and the first non-signal pad is electrically connected to the second patterned conductive layer and the second patterned conductive layer is electrically connected to the non-signal terminal of the first patterned conductive layer through the conductive wall, and the slot in the package substrate exposes the signal pad; and at least a first conductive wire passing through the slot such that one end of the first conductive wire is connected to the signal pad and the other end of the conductive wire is connected to the signal terminal of the first patterned conductive layer.

2. The chip package of claim 1, wherein the package further comprises an encapsulant encapsulating at least the chip, the slot of the package substrate and the first conductive wires.

3. The chip package of claim 1, wherein the package further comprises a plurality of contact points disposed on the first patterned conductive layer.

4. The chip package of claim 3, wherein the contact points are solder balls or pins.

5. The chip package of claim 1, wherein the package further comprises a conductive layer disposed between the first non-signal pad and the second patterned conductive layer for electrically connecting the first non-signal pad and the second patterned conductive layer.

6. The chip package of claim 5, wherein the conductive layer comprises conductive adhesive or solder material.

7. The chip package of claim 1, wherein the first non-signal pad comprises a ground pad or a power pad.

8. The chip package of claim 1, wherein the chip further comprises at least a second non-signal pad and the slot in the package substrate exposes the second non-signal pad.

9. The chip package of claim 8, wherein the package further comprises at least a second conductive wire passing through the slot such that one end of the second conductive wire connects with the second non-signal pad while the other end of the second conductive wire connects with the non-signal terminal of the first patterned conductive layer.

10. The chip package of claim 8, wherein the second non-signal pad comprises a ground pad or a power pad.

11. A chip package, comprising:
a package substrate with a first surface, a second surface and a slot penetrating the package substrate;
a circuit layer disposed on the first surface of the package substrate and extends through the inner surface of the slot to the second surface of the package substrate;
a chip disposed on the second surface of the package substrate to cover the slot and a portion of the circuit layer, wherein the chip has at least a signal pad and at least a first non-signal pad, and the first non-signal pad is electrically connected with the circuit layer on the second surface and the slot in the package substrate exposes the signal pad; and at least a first conductive wire passing through the slot such that one end of the first conductive wire is connected to the signal pad while the other end of the first conductive wire is connected to the circuit layer on the first surface of the package substrate.

12. The chip package of claim 11, wherein the package further comprises an encapsulant encapsulating at least the chip, the slot of the package substrate and the first conductive wire.

13. The chip package of claim 11, wherein the package further comprises a plurality of contact points disposed on the circuit layer on the first surface.

14. The chip package of claim 13, wherein the contact points are solder balls or pins.

15. The chip package of claim 11, wherein the package further comprises a conductive layer disposed between the first non-signal pad and the circuit layer on the second surface for electrically connecting the first non-signal pad to the circuit layer on the second surface.

16. The chip package of claim 15, wherein the conductive layer comprises conductive adhesive or solder material.

17. The chip package of claim 11, wherein the first non-signal pad comprises a ground pad or a power pad.

18. The chip package of claim 11, wherein the chip further comprises at least a second non-signal pad and the slot exposes the second non-signal pad.

19. The chip package of claim 18, wherein the package further comprises at least a second conductive wire passing through the slot such that one end of the second conductive wire connects with the second non-signal pad while the other end of the second conductive wire connects with the circuit layer on the first surface.

20. The chip package of claim 18, wherein the second non-signal pad comprises a ground pad or a power pad.

* * * * *

UNITED STATES PATENT AND TRADEMARK OFFICE
CERTIFICATE OF CORRECTION

PATENT NO.        : 7,091,608 B2
APPLICATION NO.   : 11/064136
DATED             : August 15, 2006
INVENTOR(S)       : Jimmy Hsu et al.

It is certified that error appears in the above-identified patent and that said Letters Patent is hereby corrected as shown below:

In the title page, item (73) Assignee, please replace Assignee information from "Chunghwa Picture Tubes, Ltd. Taipei (TW)" to -- VIA Technologies, Inc. Taipei Hsien (TW) --

Signed and Sealed this
First Day of March, 2011

David J. Kappos
*Director of the United States Patent and Trademark Office*